United States Patent
Matsuura

(10) Patent No.: US 8,313,806 B2
(45) Date of Patent: Nov. 20, 2012

(54) VAPOR DEPOSITION METHOD AND APPARATUS

(75) Inventor: Hiroyasu Matsuura, Yokohama (JP)

(73) Assignees: Hitachi Displays, Ltd., Chiba-ken (JP); Panasonic Liquid Display Co., Ltd., Hyogo-ken (JP)

( * ) Notice: Subject to any disclaimer, the term of this patent is extended or adjusted under 35 U.S.C. 154(b) by 830 days.

(21) Appl. No.: 12/216,060

(22) Filed: Jun. 27, 2008

(65) Prior Publication Data

US 2009/0017192 A1    Jan. 15, 2009

(30) Foreign Application Priority Data

Jul. 12, 2007 (JP) .................... 2007-183242

(51) Int. Cl.
*C23C 16/00* (2006.01)
*B05D 5/00* (2006.01)
*B05D 1/32* (2006.01)

(52) U.S. Cl. ........... 427/255.28; 427/255.23; 427/248.1; 427/256; 427/282

(58) Field of Classification Search ............ 427/255.28, 427/255.23, 248.1, 256, 282
See application file for complete search history.

(56) References Cited

U.S. PATENT DOCUMENTS

| | | | |
|---|---|---|---|
| 6,202,591 B1 * | 3/2001 | Witzman et al. | 118/723 VE |
| 2002/0179013 A1 * | 12/2002 | Kido et al. | 118/718 |
| 2005/0153472 A1 | 7/2005 | Yotsuya | |
| 2006/0240669 A1 * | 10/2006 | Kaneko et al. | 438/680 |
| 2007/0178225 A1 * | 8/2007 | Takanosu et al. | 427/69 |

FOREIGN PATENT DOCUMENTS

| | | | |
|---|---|---|---|
| JP | 11-335820 | | 12/1999 |
| JP | 2002-180241 | | 12/2000 |
| JP | 2002-180241 | * | 6/2002 |
| JP | 2004-214185 | | 12/2003 |
| JP | 2004-214185 | | 7/2004 |
| JP | 2004214185 A | * | 7/2004 |
| JP | 2004-269968 | | 9/2004 |
| JP | 2006-237161 | | 2/2005 |
| JP | 2006-260939 | | 3/2005 |
| JP | 2007-046100 | | 8/2005 |
| JP | 2006-104497 | | 4/2006 |
| JP | 2006-330684 A | | 12/2006 |
| JP | 2007-046100 | | 2/2007 |

* cited by examiner

*Primary Examiner* — Kelly M Gambetta
(74) *Attorney, Agent, or Firm* — Stites & Harbison, PLLC; Juan Carlos A. Marquez, Esq.

(57) ABSTRACT

Provided is a method for moving, in a vacuum chamber carrying therein a fixedly-provided evaporation source, a substrate toward the evaporation source together with a mask closely attached to the substrate surface, and onto the surface substrate, evaporating a material vaporized in the evaporation source through an aperture formed to the mask. In this method of the invention, means for moving the substrate toward the evaporation source is provided with cooling means not to come in contact with but to be in proximity to a surface of the mask on the evaporation source side, and a cooling plate formed with an aperture proximal to the evaporation source is disposed. With such a configuration, the steam of the material coming from the evaporation source is directed to the mask and the substrate through the aperture of the cooling plate. As such, the material film evaporated on the substrate surface shows a satisfactory distribution of film thickness, and any possible misalignment from desired positions of evaporation can be accordingly suppressed.

8 Claims, 9 Drawing Sheets

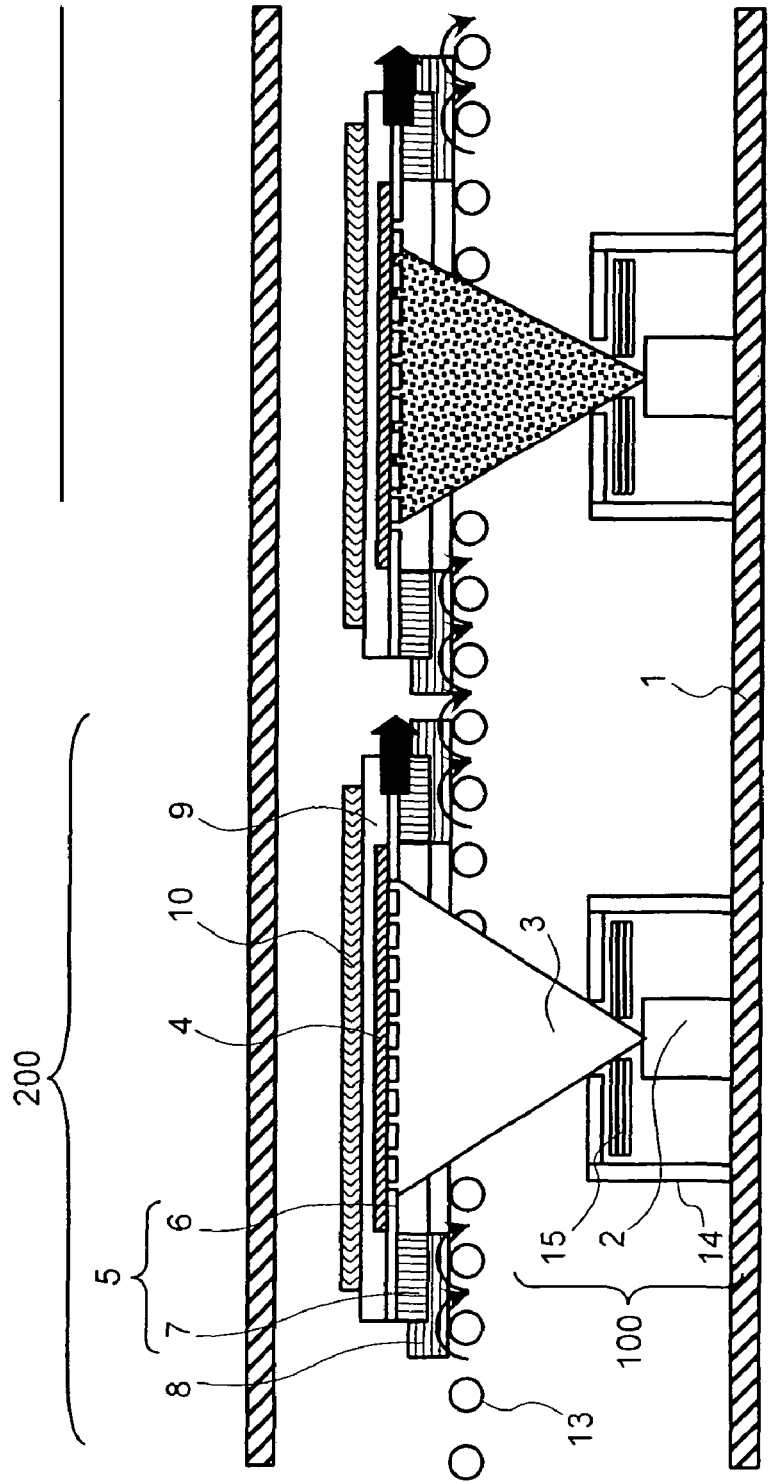
FIG.8 *Prior Art*

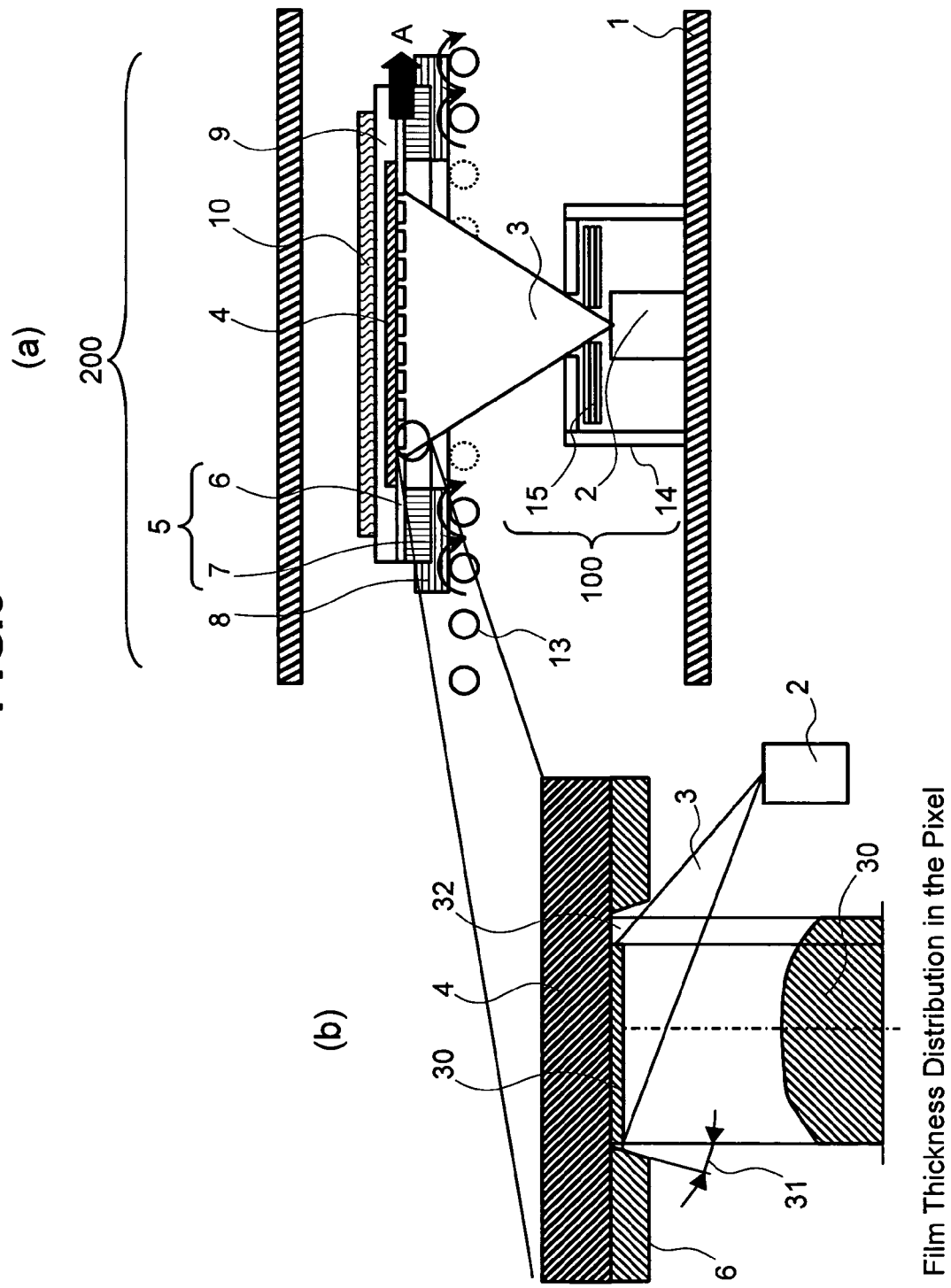

ized up to the vaporization temperature or closer in
VAPOR DEPOSITION METHOD AND APPARATUS The present application claims priority from Japanese application JP2007-183242 filed on Jul. 12, 2007, the content of which is hereby incorporated by reference into this application.

BACKGROUND OF THE INVENTION

1. Field of the Invention

The present invention relates to vapor deposition method and apparatus and, more specifically, to vapor deposition method and apparatus suitable for forming an organic material layer configuring an organic electroluminescence element.

2. Description of the Related Art

In an organic electroluminescence (hereinafter, organic EL) display device, organic EL elements to be driven by current are two-dimensionally arranged for image display. The organic EL elements are each generally configured by an insulator substrate formed thereon with a pair of electrodes. The substrate is made of glass, for example, and is exemplified by an active substrate formed thereon with a thin-film transistor or others for pixel driving. On one of the pair of electrodes, organic material thin films, i.e., organic films, are formed in order. The organic material thin films include a hole-injection layer, a hole transport layer, an emission layer, an electron transport layer, and an electron-injection layer, and over the top layer of the resulting laminate structure, an electrode film of the remaining electrode is formed. Above such an electrode film of the remaining electrode, an encapsulation substrate is provided for protecting the organic EL elements from the external atmosphere, and preventing moisture or others from entering thereinto. The encapsulation substrate is also referred to as encapsulation cap.

By the pair of electrodes formed with such a laminate structure sandwiching therebetween, a flow of current is directed in the layer-laminated direction of the laminate structure. At least one of the pair of electrodes is configured by a transparent electrode in a so-called bottom emission type. The transparent electrode easily passes through visible light, and emits display light to the side of the active substrate. Needless to say, but the encapsulation substrate is also a transparent substrate.

More specifically, a glass- or plastic-made transparent substrate is formed thereon with one of a pair of electrodes provided to every pixel, i.e., first electrode (generally anode electrode). On the first electrode, various layers are laminated in order so that an emission layer is configured. The various layers include a hole-injection layer, a hole transport layer, an emission layer, an electron transport layer, and an electron-injection layer. After such layer lamination, the electron-injection layer, i.e., the top layer of the resulting laminate structure, is covered by the remaining electrode, i.e., second electrode (generally cathode electrode), thereby a flow of current is directed between the first and second electrodes. With the flow of current, carriers (electrons and positive holes) having been injected into the laminate structure, i.e., emission layer, are coupled again so that light is emitted. If with a so-called top emission type with which display light is directed in a direction opposite to the encapsulation substrate, the first electrode may be a reflecting electrode made of a metal film, and the active substrate may not also be necessarily transparent. Note that, in the below, the active substrate is simply referred to as substrate unless otherwise required.

An organic film is generally formed by vacuum vapor deposition method. The organic material layers configuring the laminate structure formed on the substrate as such are each formed by evaporating an organic material on the main surface of a substrate placed in a vacuum chamber. Before such material evaporation, the organic material is heated, for vaporization, up to the vaporization temperature or closer in an evaporation crucible of an evaporation source unit, which is disposed in the vacuum chamber in a vacuum atmosphere. More in detail, on the main surface of a substrate placed in a vacuum chamber, a metal-made mask (so-called metal mask) is disposed with an aperture pattern corresponding to the pixel arrangement on the main surface.

Through the aperture of the mask, the vaporized organic material is evaporated on a specific area of the main surface of the substrate, e.g., portion corresponding to each pixel, so that the organic material is evaporated thereon in the form of a thin film. Herein, for evaporation of the emission layer described above, a main material, i.e., an organic material, may be evaporated on the specific area of the main surface of the substrate together with an additive material e.g., organic material of another type, at the same time.

The metal mask is attached or welded to a mask frame, i.e., metal-made frame, with tension applied for keeping flat the plane thereof. In the below, the combination of the metal mask and the mask frame is referred to as evaporation mask.

The evaporation crucible is provided with a vaporizer vessel for storing therein an organic material. The organic material stored in the vaporizer vessel is vaporized so that an evaporation film of the organic compound is formed on the substrate placed in the vacuum chamber. This vaporizer vessel is provided with an exhaust nozzle, i.e., nozzle portion, for use to control the direction and amount of the vaporized organic material dispersing into the vacuum chamber.

Generally, the vacuum vapor evaporation method is mainly classified into two systems, i.e., cluster system and in-line system. Patent Document 1 (JP-A-2006-260939) describes the cluster system in which a vacuum chamber, i.e., transfer chamber, is disposed at the center for transfer use, and another vacuum chamber (processing chamber) is disposed therearound for film formation use. The transfer chamber at the center is provided therein with a robot, and transfers only substrates one by one. Thus transferred substrates are each heated first in a heating chamber, and the heated substrate is then transferred to an oxygen plasma processing chamber for surface conditioning. After cooling the substrate in a cooling chamber, the substrate is transferred to another cluster device for a process of film formation.

For film formation, in the processing chambers, an evaporation mask and a substrate are made ready for each thereof, and are aligned and overlaid one on the other before film formation. In Patent Document 1, the substrates are cooled in advance before film formation as such so that any misalignment possibly caused by thermal expansion of the substrates has been prevented. For film formation, two methods have been in practical use, i.e., forming a film by scanning an evaporation source with the substrate side fixed, and fixing an evaporation source with the substrate side fixed.

Patent Document 2 (JP-A-2002-348659 and its counterpart United States Patent Application Publication No. US 2002-0179013 A1) describes the in-line system in which processing chambers are disposed in order of a process of film formation, and a combined structure of an evaporation mask and a substrate overlaid one on the other is fixed to a carrier. The resulting carrier is transferred by a transfer roller disposed in each of the processing chambers. The processing chambers are each provided with a fixed evaporation source, and film formation is carried out by the carrier passing in the front of the evaporation source.

In the cluster system, a substrate is transferred between a transfer chamber and a processing chamber, and after such a substrate transfer, the substrate is required to be aligned with an evaporation mask in each of the processing chambers. In consideration thereof, for processing substrates in a sequential manner, the in-line system leads to better efficiency in terms of throughput and the use of material.

On the other hand, with vacuum vapor evaporation, there is a problem when films are formed differently on the basis of pixel, i.e., both a substrate and an evaporation mask are increased in temperature, thereby causing misalignment due to thermal expansion. Patent Document 3 (JP-A-2004-214185) proposes a method of reducing such a temperature increase of a substrate and an evaporation mask with a structure in which a crucible opposing a substrate is formed with a portion protruding toward the substrate, and the protrusion portion is formed with a hole for discharge of steam, thereby preventing any possible radiant heat around the protrusion portion.

SUMMARY OF THE INVENTION

FIG. 8 is a schematic cross-sectional view of a previous vapor deposition apparatus of the in-line system, cut along a substrate-feeding direction. FIGS. 9A and 9B are each a diagram for illustrating reduction of film thickness around pixels caused by a shadow effect resulted from an evaporation mask. Specifically, FIG. 9A shows a portion of a carrier unit 200 of FIG. 8, and FIG. 9B is an enlarged view of a pixel portion circled in FIG. 9A. In FIG. 8, an evaporation source unit 100 is disposed inside of a vacuum chamber 1. The evaporation source unit 100 is configured to include an evaporation source 2, a cooling plate 14, and a reflector 15. The side of a substrate 4 to be transferred above the cooling plate 14 is formed with the above-described exhaust nozzle, from which jets of steam 3 are directed. To the substrate 4, an evaporation mask 5 is disposed close to the side of the evaporation source unit 100. The evaporation mask 5 is configured to include a metal mask 6, and a mask frame 7 straining the metal mask 6.

The evaporation mask 5 is attached close to the metal mask 6 by a plate 9 and a magnet 10. This evaporation mask 5 is placed on a carrier 8 moving in the direction of an arrow A on transfer rollers 13, and is then transferred through the jets of stream 3. The carrier 8 carrying thereon the substrate 4 is referred to as carrier unit 200. As shown in FIG. 8, in the process of repeatedly forming a film, the evaporation mask 5 and the substrate 4 placed on the carrier 8 are both increased in temperature due to the radiant heat coming from the evaporation source 2 heated up to a range from 250° C. to 400° C.

Generally, the substrate 4 preferably made of glass has a thermal expansion coefficient different from that of the evaporation mask 5 made of metal. As such, when both the substrate 4 and the evaporation mask 5 are increased in temperature, any target pixel suffers from misalignment of the evaporation. Firm formation is carried out in a vacuum atmosphere, and the components, i.e., the carrier 8, the evaporation mask 5, and the substrate 4, are increased in temperature. Moreover, because the carrier 8 and the evaporation mask 5 are stored in a vacuum atmosphere for repeated use, the carrier 8 and the evaporation mask 5 both have a difficulty in heat dissipation. As a result, if the apparatus is put in the long-term continuous operation, the firm-forming position is misaligned with respect to pixels between before and after the film formation.

Assuming here is that the steam coming from the evaporation source is low in directivity, and the steam reaches a wide range of area. If this is the case, as shown in FIG. 9B, when material evaporation is started when the substrate 4 is located away from the evaporation source 2, a metal mask shadow 32 appears, whereby an evaporation film 30 suffers from a phenomenon of reducing the film thickness around the pixels, i.e., shadow effect. If the film thickness varies as such, when a flow of current is directed between a pair of electrodes, the current density in the film resultantly varies. Such varying current density accordingly increases the light emission intensity in the portions where the film thickness is thin, thereby accelerating deterioration partially in the film.

To prevent such a shadow effect, the aperture portion of the hole formed to the metal mask 6 on the evaporation source side maybe increased in size so that a taper angle 31 is provided, thereby preventing the shadow of the metal mask 6 from appearing. Alternatively, the steam 3 from the evaporation source 2 may be increased in directivity, thereby narrowing down the area available for material evaporation. With the increasing resolution of an organic EL panel, the metal mask 6 is indeed reduced in hole pitch, but reducing the plate thickness of the metal mask 6 is difficult due to the concern over the strength thereof, thereby resulting in a limitation for thickness reduction. In order to increase the directivity of the steam 3, increasing the depth of the exhaust nozzle, i.e., nozzle, formed to the crucible in the evaporation source 2, and reducing the diameter (or width) of the nozzle will do. However, this does not completely solve the problem, and due to the microscopic asperities on the internal surface of the nozzle, the steam is diffused over an area wider than desired.

An object of the invention is to provide vapor deposition method and apparatus suitable for manufacturing an organic EL display device with which any possible temperature increase can be reduced for a substrate, an evaporation mask, and a carrier, and the product quality can be stabilized with suppressed positional misalignment of evaporation with respect to the substrate.

In order to achieve the object above, the typical vapor deposition method and apparatus of the invention are as below. The invention is suitable for forming a laminate structure made of an organic material that configures an emission layer for organic EL elements. That is, a first aspect of the invention is directed to a vapor deposition method for fixing a material serving as an evaporation source in an evaporation source unit disposed in a vessel in a vacuum atmosphere, and evaporating the material at a predetermined position of a substrate while the substrate is being moved across steam coming from a vapor exhaust nozzle of the evaporation source unit. For such material evaporation, the substrate is closely attached with an evaporation mask including a sheet formed with a hole at the position for evaporating the material, and a mask frame for keeping flat the sheet. The mask frame is moved by movement means including a plurality of rollers provided to the vessel in the vacuum atmosphere. On a course for the mask frame to move, to the evaporation mask and the substrate, through an aperture portion located partially proximal to the evaporation source in a cooling plate including cooling means disposed not to come in contact with but to be in proximity to a surface of the mask frame on the evaporation source side, the steam of the material coming from the vapor exhaust nozzle of the evaporation source unit is directed.

A second aspect of the invention is directed to a vapor deposition method for fixing a material serving as an evaporation source in an evaporation source unit disposed in a vessel in a vacuum atmosphere, and evaporating the material at a predetermined position of a substrate by moving the substrate across steam coming from a vapor exhaust nozzle of the evaporation source unit. For material evaporation as such, the substrate is closely attached with an evaporation mask including a sheet formed with a hole at the position for evaporating the material, and a mask frame for keeping flat the sheet. The mask frame is moved by a plurality of rollers provided to the vessel in the vacuum atmosphere, and a carrier formed with an aperture portion for closely attaching the evaporation mask thereto for transfer. On a course for the mask frame to move, to the evaporation mask and the substrate, through an aperture portion located partially proximal to the evaporation source in a cooling plate including cooling means disposed not to come in contact with but to be in proximity to a surface of the mask frame on the evaporation source side, the steam of the material coming from the vapor exhaust nozzle of the evaporation source unit is directed.

In the evaporation methods of the first and second aspects of the invention, characteristically, the aperture portion of the cooling plate provided proximal to the evaporation source is larger in width in a direction of feeding the substrate than a width of the vapor exhaust nozzle of the evaporation source unit in the direction of feeding the substrate, and is shorter in length than a length thereof in the direction of feeding the substrate. Moreover, cooling is provided by a coolant circulated in each of the rollers for transfer use from outside of the vessel in the vacuum atmosphere.

A third aspect of the invention is directed to a vapor deposition apparatus for fixing a material serving as an evaporation source in an evaporation source unit disposed in a vessel in a vacuum atmosphere, and evaporating the material at a predetermined position of a substrate while the substrate is being moved across steam coming from a vapor exhaust nozzle of the evaporation source unit. The apparatus includes: an evaporation mask including a sheet formed with a hole at the position for evaporating the material to the substrate, and a mask frame for keeping flat the sheet; evaporation mask attaching means provided to the substrate on a side of the evaporation source for closely attaching together the substrate and the evaporation mask; mask frame moving means using a plurality of rollers provided to the vessel in the vacuum atmosphere; and a cooling plate provided on a course for the mask frame to move with cooling means disposed not to come in contact with but to be in proximity to a surface of the mask frame on the side of the evaporation source, and with an aperture portion located partially proximal to the evaporation source. In the apparatus, through the aperture portion of the cooling plate, the steam of the material generated in the evaporation source is directed to the evaporation mask and the substrate.

A fourth aspect of the invention is directed to a vapor deposition apparatus for fixing a material serving as an evaporation source in an evaporation source unit disposed in a vessel in a vacuum atmosphere, and evaporating the material at a predetermined position of a substrate by moving the substrate across steam coming from the evaporation source. The apparatus includes: an evaporation mask including a sheet formed with a hole at the position for evaporating the material to the substrate, and a mask frame for keeping flat the sheet; evaporation mask attaching means provided to the substrate on a side of the evaporation source for closely attaching together the substrate and the evaporation mask; a carrier that closely attaches the evaporation mask to the substrate on the side of the evaporation source, and is formed with an aperture portion for transfer of the resulting substrate; carrier moving means using a plurality of rollers provided to the vessel in the vacuum atmosphere; and a cooling plate provided on a course for the mask frame to move with cooling means disposed not to come in contact with but to be in proximity to a surface of the carrier on the side of the evaporation source, and with an aperture portion located partially proximal to the evaporation source. In the apparatus, through the aperture portion of the cooling plate, the steam of the material coming from a vapor exhaust nozzle of the evaporation source unit is directed to the evaporation mask and the substrate.

In the vapor deposition apparatuses of the third and fourth aspects of the invention, characteristically, the aperture portion of the cooling plate provided proximal to the evaporation source is larger in width in a direction of feeding the substrate than a width of the vapor exhaust nozzle of the evaporation source unit, and is shorter in length than a length thereof in the direction of feeding the substrate. Moreover, cooling is provided by a coolant circulated in each of the rollers for transfer use from outside of the vessel in the vacuum atmosphere.

Also in the vapor deposition apparatuses of the third and fourth aspects of the invention, characteristically, a black coating is provided to the mask frame, and to the cooling plate on a side of the mask frame, and/or to the mask frame, to a surface of the carrier opposing the mask frame, and to the cooling plate on a side of the carrier.

According to the aspects of the invention, in vacuum vapor deposition of the so-called in-line system, a cooling board placed inside of a vacuum chamber is located proximal to a carrier or the frame of an evaporation mask during transfer thereof and film formation. This accordingly prevents, more than previous, radiant heat coming from the high-temperature evaporation source from being transmitted to the substrate, the evaporation mask, and the carrier. At the same time, the evaporation mask and the carrier can be cooled by radiation to the cooling board. If transfer rollers are each provided with the cooling capability, the cooling effect can be increased to a further extent.

As such, any possible temperature increase can be suppressed for the components, i.e., the substrate, the evaporation mask, and the carrier, thereby being able to prevent misalignment of evaporation positions. What is more, because any temperature change to be caused due to the repeated use of the evaporation mask and the carrier can be also suppressed, any possible misalignment of evaporation can be reduced before and after film formation, thereby stabilizing the product quality.

The aperture portion of the cooling board is so provided as to come in an area above the evaporation source for evaporation. With such a configuration, the steam that often becomes out of control even with a nozzle of the evaporation source and thus dissipates in a wide range of area can be reduced, and is allowed to be evaporated only to any needed area. This favorably reduces a shadow effect in the substrate-feeding direction, thereby being able to relax the distribution of evaporation film thickness in pixels, stabilizing the element characteristics, and enabling to manufacture long-life elements.

BRIEF DESCRIPTION OF THE DRAWINGS

FIG. 8 is a schematic cross-sectional view of a previous vapor deposition apparatus of the in-line system, cut along the substrate-feeding direction; and FIGS. 9A and 9B are each a diagram for illustrating the reduction of film thickness around pixels as a result of a shadow effect resulted from an evaporation mask.

DETAILED DESCRIPTION

In the below, vapor deposition method and apparatus in most preferred embodiments of the invention are described in detail by referring to the accompanying drawings showing the vapor deposition apparatus.

First Embodiment

Figure 1:
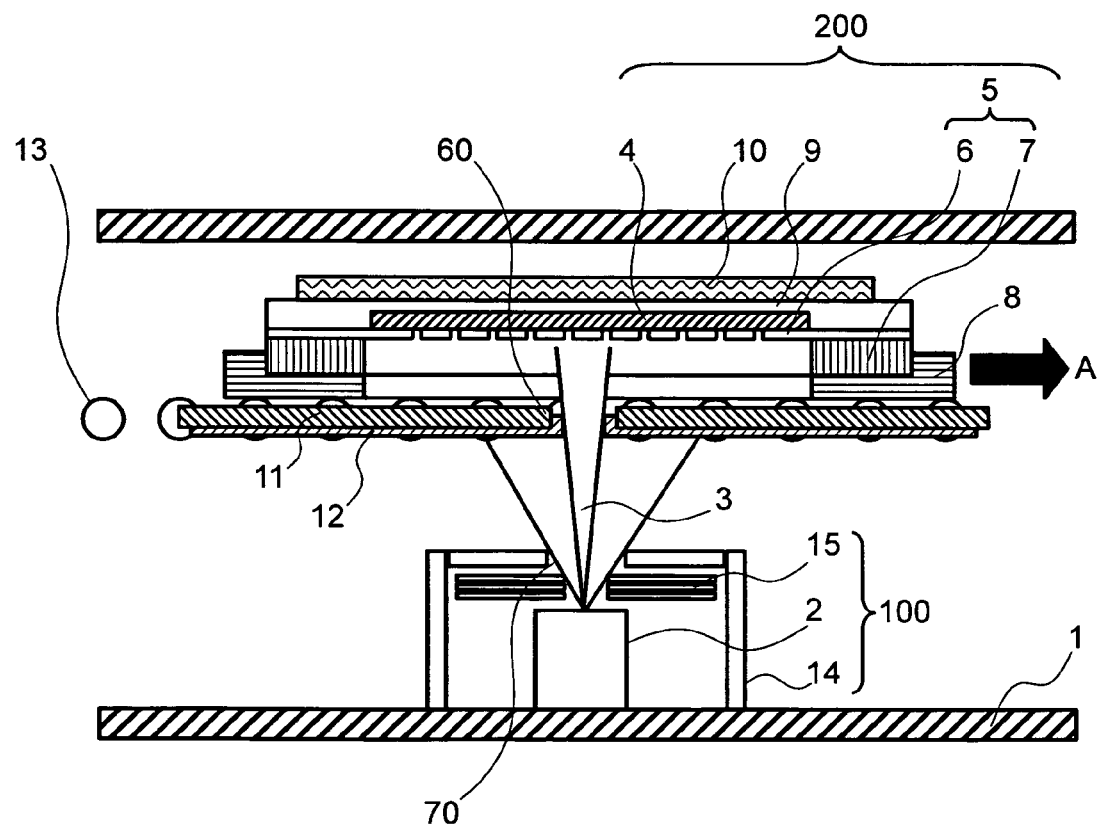
FIG. 1 is a cross-sectional view of a vapor deposition apparatus in a first embodiment of the invention.
Figure 2:
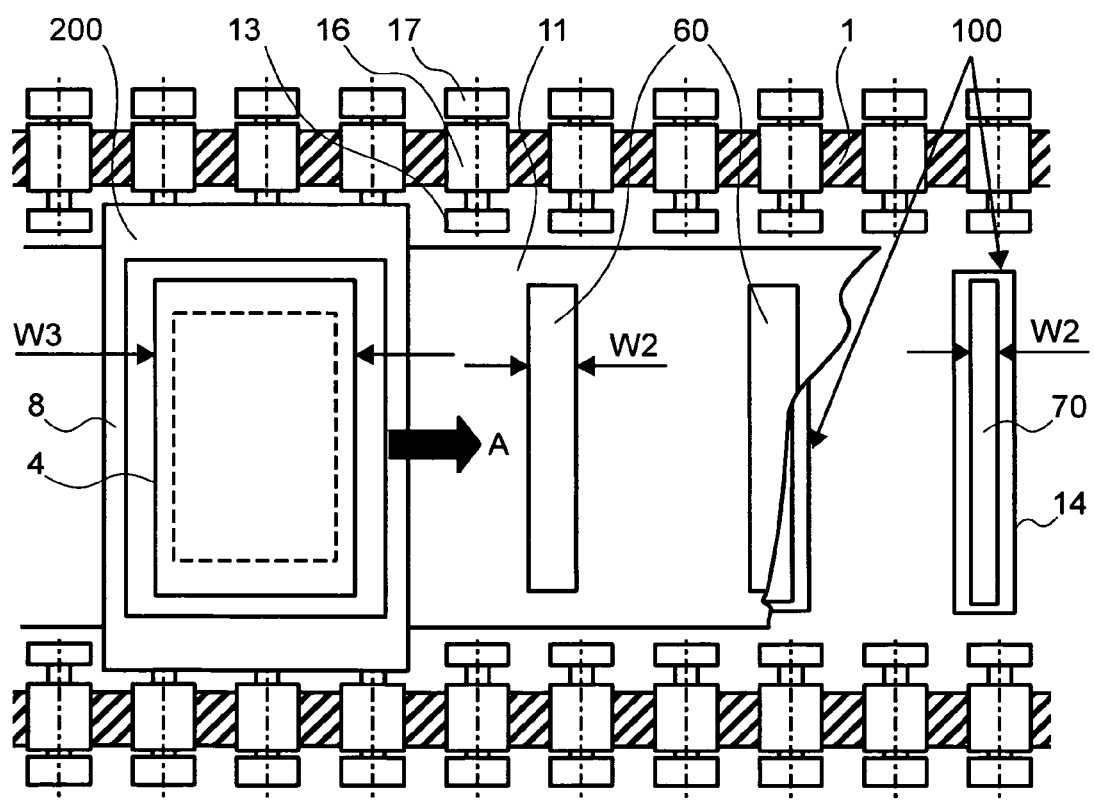
FIG. 2 is a plan view of the vapor deposition apparatus of FIG. 1 viewed from above.

FIG. 1 is a cross-sectional view of a vapor deposition apparatus in a first embodiment of the invention. FIG. 2 is a plan view of the vapor deposition apparatus of FIG. 1, viewed from above. Any component similar to that in the previous example is provided with the same reference numeral. Inside of the vacuum chamber 1 being a vessel in a vacuum atmosphere, the evaporation source unit 100 is disposed. In the evaporation source unit 100, a material serving as an evaporation source is fixedly provided. The evaporation source unit 100 is formed with a vapor exhaust nozzle 70 from which jets of steam are directed. Above the evaporation source unit 100 in the vacuum chamber 1, the carrier set 200 is disposed to be moved by the transfer rollers 13 in the direction of an arrow A.

A cooling board 11 is provided to be a piece with the transferring carrier set 200 on the side closer to the evaporation source unit 100. The cooling board 11 is provided with, on the side of the evaporation source unit 100, an attachment-prevention plate 12 for preventing any attachment of steam to the cooling board 11. While the evaporation target, i.e., the substrate 4, is moved in the direction of the arrow A across the steam 3 coming from the vapor exhaust nozzle 70, the material is evaporated to a predetermined position of the substrate 4 via both an aperture portion 60 of the cooling board 11 and the evaporation mask 5. The evaporation source 2 is fixed, and then supplies the steam 3 in the direction vertical to its own surface attached to the vacuum chamber 1.

As described above, on the carrier 8 having an aperture portion at the center, the evaporation mask 5 and the substrate 4 are both fixed for film formation. The carrier set 200 is configured to include such a carrier 8, the evaporation mask 5, the plate 9, and the magnet 10. The evaporation mask 5 here is the one configured by the metal mask and the frame 7, i.e., the evaporation mask 5 is configured by attaching or welding the metal mask 6 and the mask frame 7. The metal mask 6 is formed with holes to allow film formation over predetermined pixels or an area of the substrate 4. The mask frame 7 is provided for putting the metal mask 6 under tension for preventing slack in the mask. The metal mask 6, the mask frame 7, and others show a temperature change during the processing, and thus for precision compensation, using a metal material with a low expansion coefficient such as inver is preferable. The metal mask is preferably made of a material sticking the magnet.

The substrate 4 is positioned with respect to the evaporation mask 5, and while the plate 9 is being placed along the substrate 4 for preventing deformation thereof, the plate 9 is brought closer to the magnet 10 for fixation. The magnet 10 is used for closely attaching the substrate 4 and the metal mask 6.

The carrier 8 is so transferred as to across the steam 3 coming from the evaporation source 2 so that material evaporation is carried out onto the substrate 4 via the evaporation mask 5. For transferring the carrier 8 as such, a plurality of transfer rollers 13 are provided to the vacuum chamber 1. The transfer-rollers 13 are synchronously rotated at a predetermined speed by the power coming from the outside, thereby moving the carrier 8 on the transfer rollers 13 in the direction of the arrow A. The mechanism for establishing synchronization among the transfer rollers 13 is generally a gear or a timing belt. Alternatively, the mechanism of establishing electronic synchronization will do by providing a motor to each of the transfer rollers 13. However, in view of keeping the level of vacuum in the vacuum chamber 1, and in view of pollution prevention, the mechanism of establishing synchronization as such and the drive system such as motor are preferably disposed outside of the vacuum chamber 1.

Generally, for not to transmit the heat of the evaporation source 2 as radiant heat to the carrier 8, the evaporation mask 5, and the substrate 4, the area around the evaporation source 2 has been covered by the reflector 15 and the cooling plate 14. The evaporation source unit 100 is a combination of the evaporation source 2, the reflector 15, and the cooling plate 14. The study conducted by the inventor of the invention tells that, even if such an evaporation source unit 100 is used, vapor deposition in three to four levels will increase the temperature of about 5 to 30° C. In consideration thereof, the following mean is made ready.

The measures-taken cooling board 11 is disposed in the vicinity of the surface of the carrier 8 on the side of the evaporation source 2. To the cooling board 11, a coolant is directed from the outside of the vacuum chamber 1, and the coolant is circulated therein. The coolant may be water, and if this is the case, for an larger effect, preferably, cooling means may be provided to the outside of the vacuum chamber 1 for cooling the water, and the temperature of the cold water may be controlled not to cause any temperature change to the evaporation mask 5 before and after the process. In this example, the cooling board 11 is formed with the aperture portion 60 at a portion opposing the evaporation source unit 100, thereby being able to prevent, more than required, transmission of radiant heat to the components, i.e., the carrier 8, the evaporation mask 5, and the substrate 4, during the process of vapor deposition. Moreover, the carrier 8 and the cooling board 11 may be brought closer in the range from 0.5 to 3 mm, which is the limit of placement in the practical configuration, and the resulting structure is disposed parallel to the course of movement of the carrier 8. With such a configuration, any heat dissipation by radiation can be achieved while the carrier 200 is being moved.

As shown in FIG. 2, the aperture portion 60 of the cooling plate 14 in the vicinity of the evaporation source 2 has a width WI in the direction of feeding the substrate 4, i.e., direction of an arrow A, and this width W1 is larger than a width W2 but shorter than a length W3. The width W2 is of the vapor exhaust nozzle 70 of the evaporation source unit 100 in the substrate-feeding direction, and the length W3 is of the length thereof in the substrate-feeding direction.

For increasing the efficiency of heat dissipation of the carrier 8, it is desirable to form a black coating over the surface between the carrier 8 and the cooling board 11. The black coating considered effective includes black chrome plating, black alumite, and alumina-titania thermal spray, but these are surely not restrictive, and any will do as long as it does not emit gas that much in a vacuum and as long as it causes no organic pollution. Similarly, the surface between the evaporation mask 5 and the carrier 8 is also preferably subjected to the surface treatment of black.

As such, the cooling board 11 is provided, and the directivity of the steam 3 is reduced in the feeding direction of the substrate as shown in FIG. 1, thereby favorably suppressing the shadow effect of causing a variation of film thickness distribution in the pixels in the substrate-feeding direction.

The process of vapor deposition using only a piece of carrier set 200 of the first embodiment results in poor manufacturing efficiency. On the other hand, if the process of vapor deposition is performed by running a plurality of carrier sets 200 at narrower intervals, the resulting throughput can be accordingly increased. What is better, the evaporation material is increased in efficiency of attachment to the substrate 4, thereby being able to reduce any needed material cost per substrate.

With the cooling board 11 provided as such, the steam of the material not to be used for evaporation onto the substrate is trapped by the cooling board 11. This thus favorably prevents the steam 3 of the evaporation source 2 from attaching the components, e.g., the vacuum chamber 1, the carrier 8, and the transfer rollers 13, thereby being able to protect more the inside of the vacuum chamber 1 from organic pollution. As a result, the film formed on the substrate is increased in purity, thereby being able to improve the characteristics of the display elements and increase the life thereof. On the other hand, because the steam is restricted to travel, the material is resultantly heaped mainly on the side of the cooling board 11. In consideration thereof, a shield 12 is attached to the surface of the cooling board 11 opposing the evaporation source unit 100 so that the expensive evaporation source material can be collected.

Second Embodiment

Figure 3:
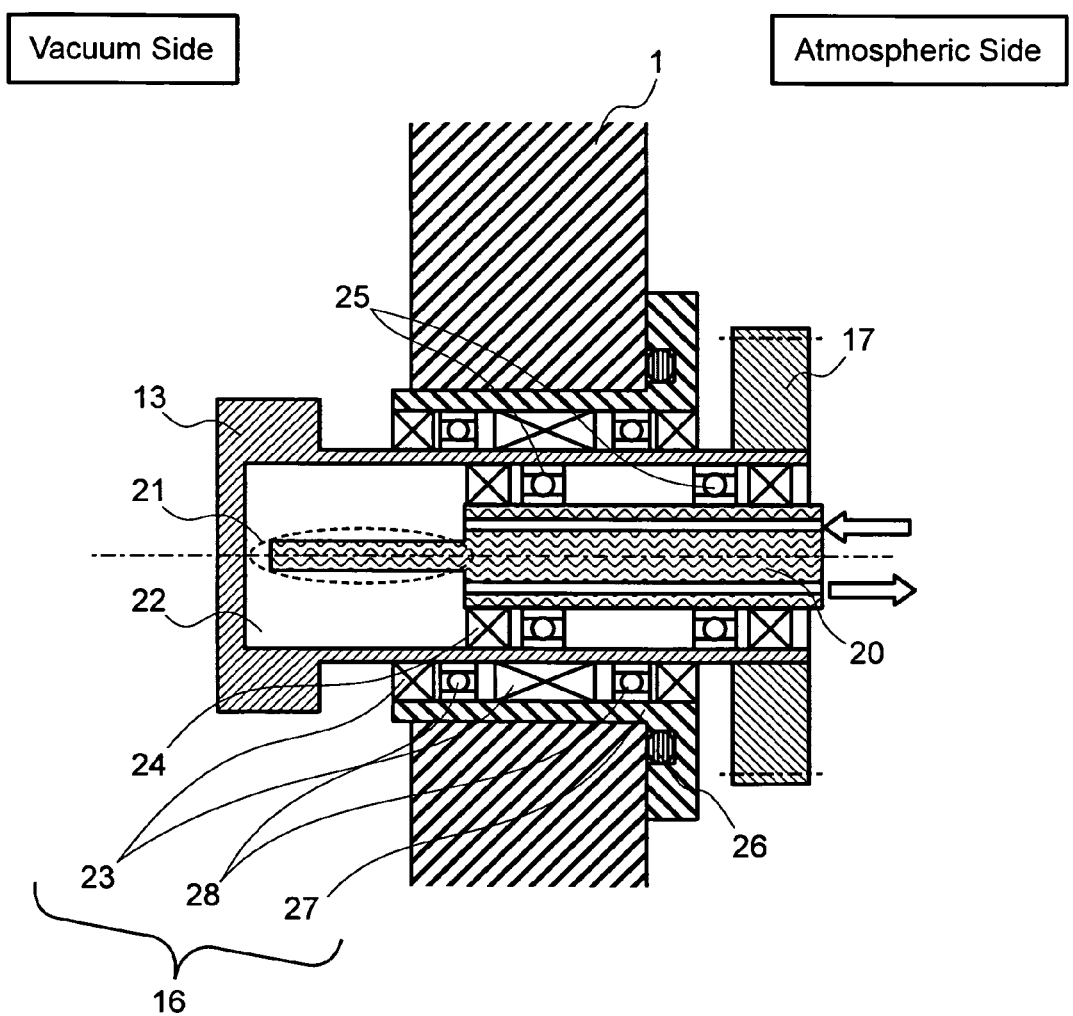
FIG. 3 is a cross-sectional view of a vapor deposition apparatus in a second embodiment of the invention, showing a cooling mechanism of a transfer roller.

FIG. 3 is a cross-sectional view of a vapor deposition apparatus in a second embodiment of the invention, showing the cooling mechanism of a transfer roller. In FIG. 3, the transfer roller 13 and the carrier 8 are the same in basic configuration as those in the first embodiment, and the evaporation source unit 100 and the carrier set 200 are the same in configuration as those in the first embodiment. The cooling mechanism of the first embodiment shown in FIG. 1 is for cooling by heat radiation from the components, i.e., the carrier 8, the evaporation mask 5, and the substrate 4. Generally, cooling by heat conduction through contact is better in efficiency than cooling by radiation, and therefore, in the second embodiment, the transfer rollers 13 are each provided with the cooling capability.

In FIG. 3, a vacuum seal for the vacuum chamber 1 and the transfer roller 13 is implemented by a magnetic fluid seal unit 16. The magnetic fluid seal unit 16 is a combination of a magnetic fluid vacuum seal 23 and a bearing 28 both housed in a case 27. The magnetic fluid vacuum seal 23 is disposed outside of the shaft portion of the transfer roller 13, and the bearing 28 enables rotation of the transfer roller 13. The case 27 and the vacuum chamber 1 are sealed airtight by an O ring 26.

In the transfer roller 13, the cylindrical portion and the shaft portion coming in contact with the carrier 8 are formed as a piece using a metal material. The metal material is surely not the only option, and any material will do as long as it allows the structure to be rigid enough, and as long as it shows relatively good thermal conductivity. The material with a low specific heat will be still better. In this example, the material is an SUS (Stainless Steel) 303. The transfer rollers 13 are driven by a transfer roller drive mechanism 17.

The transfer rollers 13 are each formed, in the shaft portion thereof, with a hole shaped like a tube when viewed from the side of ambient atmosphere. The tubular hole is provided therein with a fixed shaft 20 that is not rotated. The transfer roller 13 freely rotates about the fixed shaft 20 by a bearing 25 formed inside of the shaft. The fixed shaft 20 is formed with two holes so that a coolant 22 can be directed into the tubular portion of the transfer roller 13. For preventing the coolant 22 from being leaked from the space between the fixed shaft 20 and the transfer roller 13, a mechanical seal 24 is provided. For the purpose of allowing the coolant 22 to circulate well in the transfer roller 13, at the end portion of the fixed shaft 20 on the side of the transfer roller 13, an interference plate 21 is disposed between the two holes formed for coolant circulation, thereby allowing the coolant 22 to cool the transfer roller 13 with good efficiency.

Third Embodiment

Figure 4:
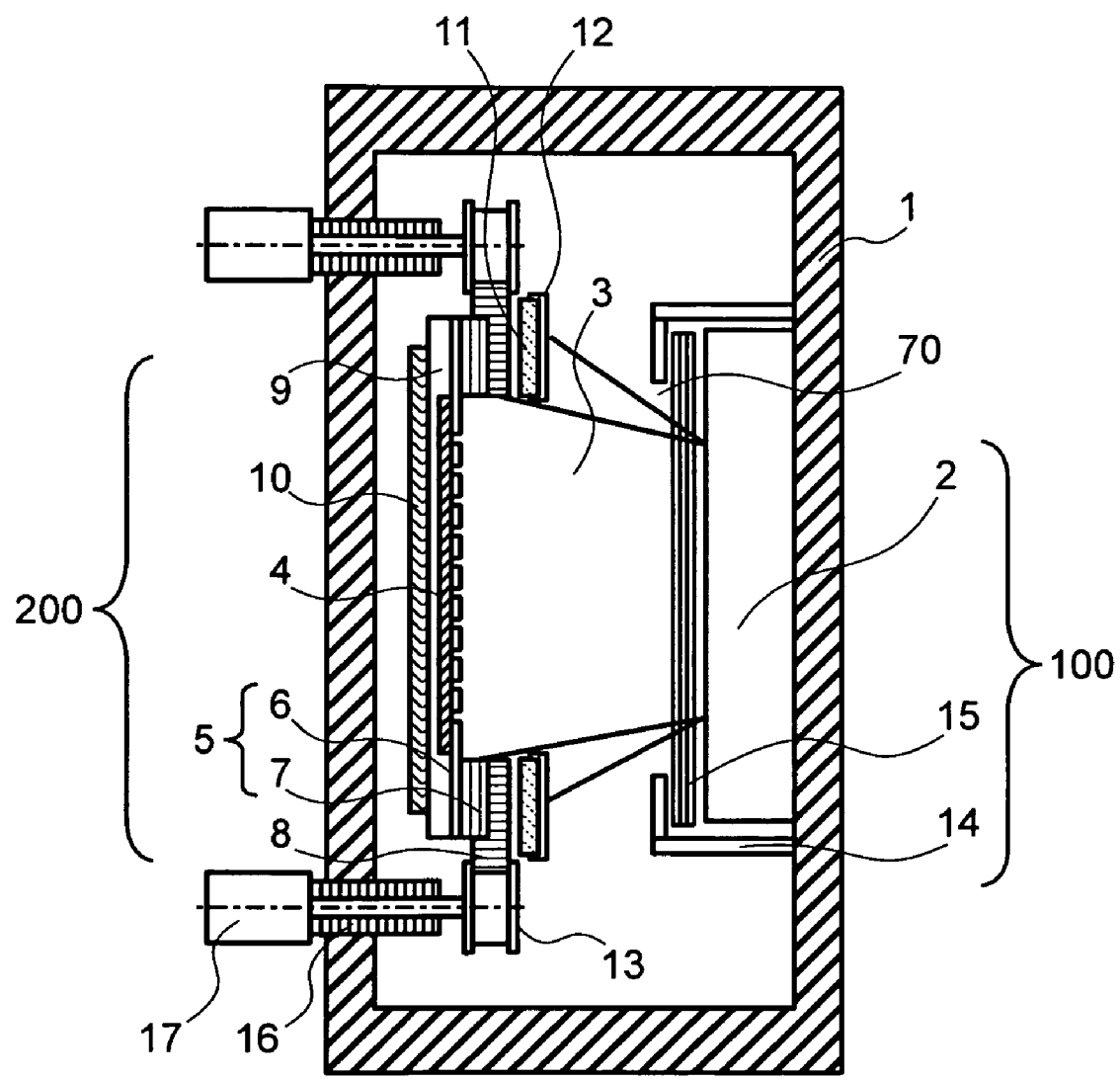
FIG. 4 is a cross-sectional view of a vapor deposition apparatus in a third embodiment of the invention, showing a carrier set 200 to be transferred from the paper surface side of FIG. 4 toward the front.
Figure 5:
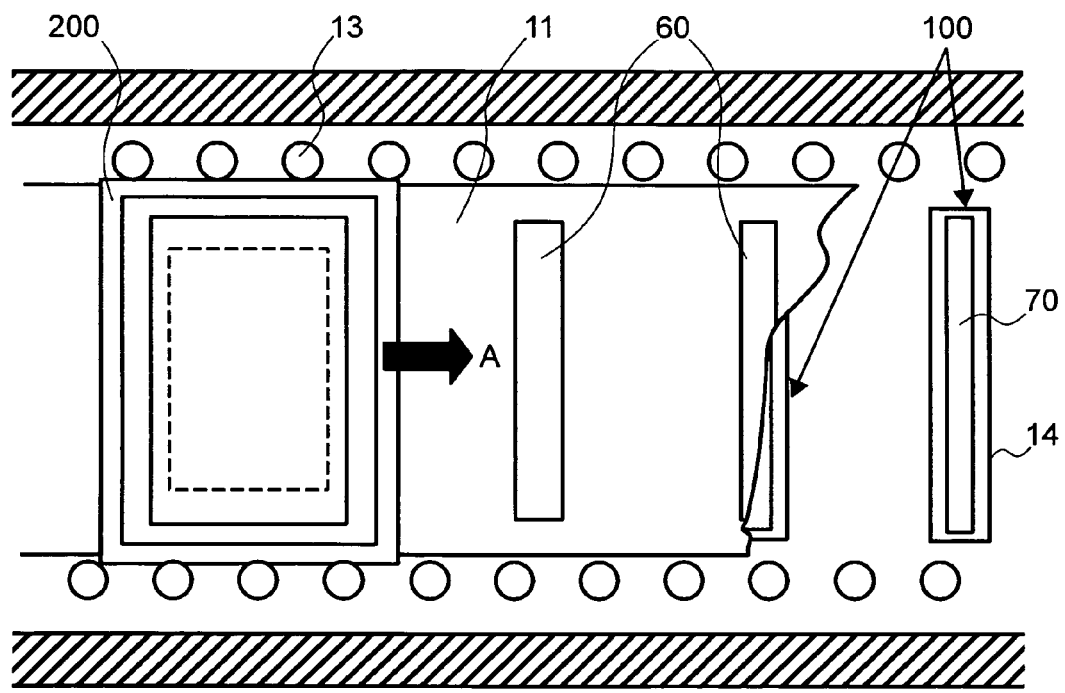
FIG. 5 is a side view of the vapor deposition apparatus of FIG. 4, viewed from the side of a substrate.

FIG. 4 is a cross-sectional view of a vapor deposition apparatus in a third embodiment of the invention. In FIG. 4, the carrier set 200 is transferred from the paper surface side toward the front. FIG. 5 is a side view of the vapor deposition apparatus of FIG. 4 viewed from the substrate side. Note that, in the third embodiment, the mask frame 7 may be provided with the function of the carrier 8 so that the carrier 8 may not be necessarily provided. In the first embodiment, the carrier set 200 carrying therein the components, i.e., the carrier 8, the evaporation mask 5, and the substrate 4, is transferred in the horizontal direction. Alternatively, in the third embodiment, the carrier set 200 is disposed upright for transfer, and during transfer of such a carrier set 200, film formation is carried out. Also in the third embodiment, the evaporation source unit 100 is attached to the side wall surface of the vacuum chamber 1 to allow the steam 3 to reach all over the substrate 4.

For transfer of the upright carrier set 200, the transfer rollers 13 are provided above and below the carrier set 200. Herein, for preventing the carrier set 200 from falling off during operation, any arbitrary guide may be provided. The carrier set 200 is not necessarily provided upright, and may be slanted to some degree for moving. As an alternative configuration, the evaporation source unit 100 may be provided below the carrier set 200, and the unit may be transferred in the diagonal direction. With such a configuration, the same effect can be achieved. The portion of the rollers 13 of the third embodiment may be of the cooling configuration of FIG. 3.

Figure 6:
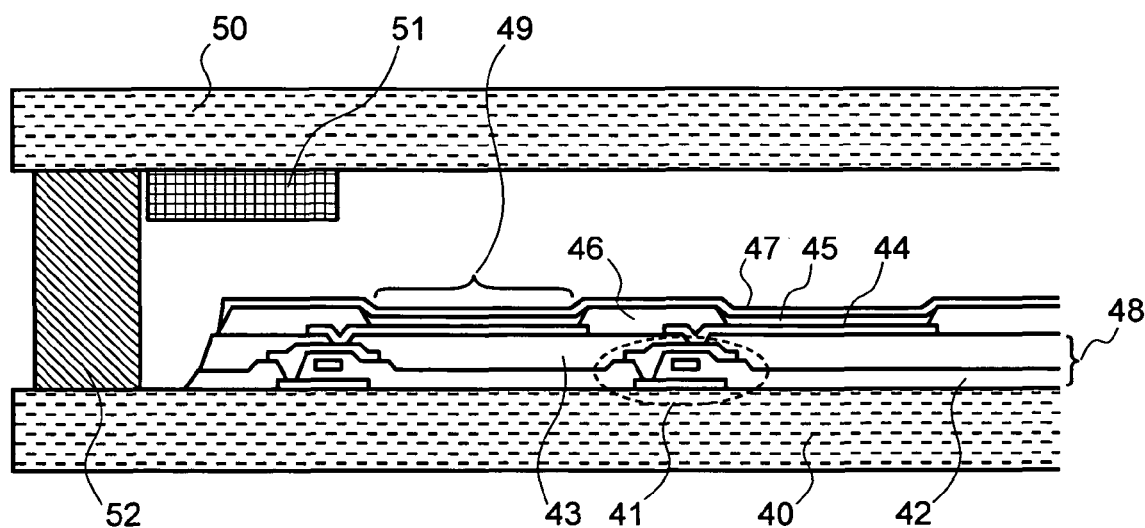
FIG. 6 is a cross-sectional view of main components of an organic EL display element to be manufactured by the vapor deposition method and apparatus of the invention.
Figure 7:
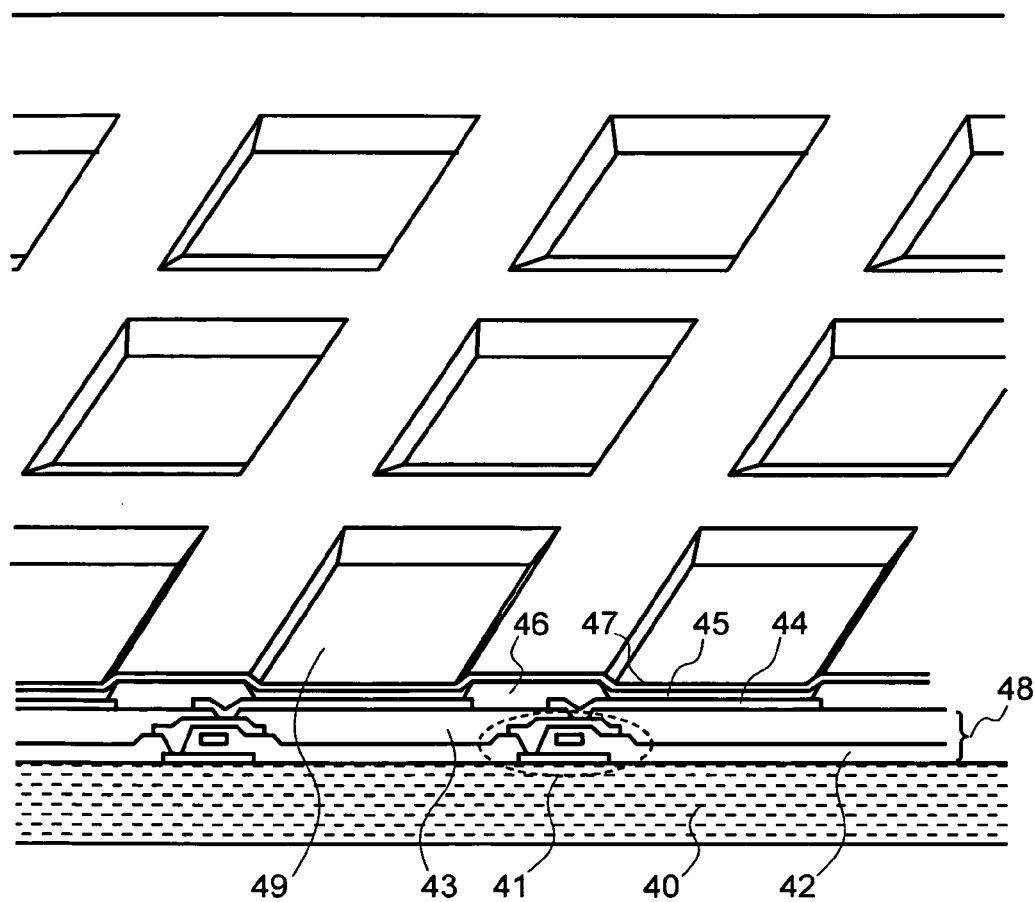
FIG. 7 is a perspective view of an active substrate of FIG. 6.

FIG. 6 is a cross-sectional view of main components of an organic EL display element to be manufactured by the vapor deposition method and apparatus of the invention. FIG. 7 is a perspective view of an active substrate of FIG. 6. In the organic EL display element, an active substrate 40 and a sealing substrate 50 are sealed airtight by a sealing member 52. The active substrate 40 is formed, on the main surface, with a thin-film transistor 41, and the portion of an insulator film 42 and a flat film 43 configures an emission drive circuit 48. On the flat film 43, a first electrode 44 is formed, and on the first electrode 44, an organic emission film 45 is evaporated as in any of the embodiments described above. Over this organic emission film 45, a second electrode 47 is formed in the shape of a film.

The organic emission film 45 is formed between banks 46 each formed by an insulator material between any adjacent pixels 49. Note that, inside of the sealing substrate 50, a desiccant 51 is filled for absorbing the moisture inside of the airtight vessel.

The invention is suitable for formation of an organic emission layer in an organic EL display device, and is also surely applicable to a vapor deposition apparatus for use in a manufacturing process for various types of apparatuses in which an organic material is evaporated.

While we have shown and described several embodiments in accordance with the present invention, it is understood that the same is not limited thereto but is susceptible of numerous changes and modifications as known to those skilled in the art, and we therefore do not wish to be limited to the details shown and described herein but intend to cover all such changes and modifications as are encompassed by the scope of the appended claims.

What is claimed is:

1. A vapor deposition method for evaporating, while a substrate is being moved, a material to the substrate through stream of the material emitted from a vapor exhaust nozzle of an evaporation source unit that includes an evaporation source and a cooling plate having a vapor exhaust nozzle and covering the evaporation source, the method comprising:
    moving the substrate, which includes a first surface having an evaporation mask, along a cooling board that is parallel to a moving direction of the substrate, cooled by a cooling mechanism, and provided between the substrate and the evaporation unit; and
    directing the steam that is generated in the evaporation source unit and evaporated through the vapor exhaust nozzle of the cooling plate to the first surface of the substrate through an aperture portion formed within the cooling board.

2. The vapor deposition method according to claim 1, wherein the aperture portion of the cooling board is larger in width in a direction in which the steam is fed to the substrate than a width of the vapor exhaust nozzle of the evaporation source unit in the direction in which the steam is fed to the substrate, and is shorter in length than a length thereof in the direction in which the steam is fed to the substrate.

3. The vapor deposition method according to claim 1, wherein rollers that are provided proximate to the cooling board are used to move the substrate, and cooling is provided by a coolant circulated in each of the rollers for transfer use.

4. The vapor deposition method according to claim 1, wherein the material evaporated to the substrate is an organic material configuring an emission layer of an organic electroluminescence display element.

5. The vapor deposition method according to claim 1, wherein the evaporation mask is made of metal and the substrate is made of one of glass or plastic.

6. The vapor deposition method according to claim 1, wherein the cooling board cools the substrate and the evaporation mask while the substrate is being moved.

7. The vapor deposition method according to claim 1, wherein the substrate is moved with the first surface in facing opposition to the cooling board.

8. The vapor deposition method according to claim 1, wherein the cooling board is larger in width in a direction in which the steam is fed to the substrate than a width of the substrate in the direction in which the steam is fed to the substrate.

* * * * *